(12) United States Patent
Yun

(10) Patent No.: US 9,171,783 B2
(45) Date of Patent: Oct. 27, 2015

(54) SEMICONDUCTOR DEVICE AND METHOD FOR MANUFACTURING THE SAME

(71) Applicant: Ki Jun Yun, Yongin-si (KR)

(72) Inventor: Ki Jun Yun, Yongin-si (KR)

(73) Assignee: Dongbu Hitek Co., Ltd., Bucheon-si (KR)

( * ) Notice: Subject to any disclaimer, the term of this patent is extended or adjusted under 35 U.S.C. 154(b) by 0 days.

(21) Appl. No.: 13/791,108

(22) Filed: Mar. 8, 2013

(65) Prior Publication Data

US 2014/0070412 A1 Mar. 13, 2014

(30) Foreign Application Priority Data

Sep. 7, 2012 (KR) .................. 10-2012-0099219

(51) Int. Cl.
*H01L 23/488* (2006.01)
*H01L 21/28* (2006.01)
*B81C 1/00* (2006.01)
*H01H 1/00* (2006.01)
*H01H 35/02* (2006.01)

(52) U.S. Cl.
CPC .......... *H01L 23/488* (2013.01); *B81C 1/00015* (2013.01); *H01H 1/0036* (2013.01); *H01L 21/28* (2013.01); *H01H 35/02* (2013.01)

(58) Field of Classification Search
CPC ................ H01L 23/488; H01L 2924/1461
USPC .................................. 438/50; 257/E29.324
See application file for complete search history.

(56) References Cited

U.S. PATENT DOCUMENTS 3,927,286 A 12/1975 Fohl
4,450,326 A 5/1984 Ledger
5,955,713 A 9/1999 Titus et al.

OTHER PUBLICATIONS

Notice of Allowance dated Dec. 27, 2013, Korean Patent Application No. 10-2012-0099219, Korean Intellectual Property Office, Republic of Korea.

*Primary Examiner* — Amar Movva
(74) *Attorney, Agent, or Firm* — Andrew D. Fortney; Central California IP Group, P.C.

(57) ABSTRACT

A method for manufacturing a semiconductor device includes forming a lower electrode pattern on a substrate, forming a first insulating layer on the lower electrode pattern, forming an upper electrode pattern on the first insulating layer, forming an etch blocking spacer at a side of the upper electrode pattern, forming a second insulating layer on the upper electrode pattern, etching the second insulating layer to form a cavity which exposes the etch blocking spacer, and forming a contact ball in the cavity.

13 Claims, 5 Drawing Sheets

SEMICONDUCTOR DEVICE AND METHOD FOR MANUFACTURING THE SAME

CROSS REFERENCE TO RELATED APPLICATION

This application claims the benefit of Korean Patent Application No. 10-2012-0099219, filed on Sep. 7, 2012, which is incorporated herein by reference as if fully set forth herein.

BACKGROUND OF THE DISCLOSURE

1. Field of the Disclosure

Embodiments of the invention relate to a semiconductor device and a method for manufacturing the same, and more particularly, to a Micro Metal Sphere switch and a method for manufacturing the same.

2. Discussion of the Related Art

A Micro Metal Sphere system (MMSs) device, a form of microelectromechanical switch (MEMS), is a device having a small size in a micro-scale, for performing a specific function of an electronic mechanical operation. The MMSs device is produced by a special process based on a semiconductor process, and a low priced batch manufacturing.

MEMS devices have wide application, such as a sensor, for example, a pressure sensor, an inertia sensor, a position sensor in GPS and game consoles, an image sensor in a digital camera, a camcorder, and so on, and also in an RF switch, a micro-resonator, a variable capacitor, and a variable inductor. Particularly, the MMSs device for a switch must be reliable as a switching device, and the process for manufacturing the MMSs device should have a stable yield.

SUMMARY OF THE DISCLOSURE

Accordingly, embodiments of the invention are directed to a semiconductor device and a method for manufacturing the same.

An object of embodiments of the invention is to provide a semiconductor device that includes an upper electrode pattern that is insensitive to etchants used in wet etching, to form or secure a space in which to place a contact ball, to improve degrees of freedom of the upper electrode pattern, to assure reliability of switching action, and to prevent a decrease in manufacturing yield, and a method for manufacturing the same.

Additional advantages, objects, and features of the disclosure will be set forth in part in the description which follows and in part will become apparent to those skilled in the art upon examination of the following or may be learned from practice of the invention. The objectives and other advantages of the invention may be realized and attained by the structure(s) particularly pointed out in the written description and claims hereof as well as the appended drawings.

To achieve these objects and other advantages and in accordance with the purpose of the invention, as embodied and broadly described herein, a method for manufacturing a semiconductor device includes the steps of forming a lower electrode pattern on a substrate, forming a first insulating layer on the lower electrode pattern, forming an upper electrode pattern on the first insulating layer, forming an etch blocking spacer at a side of the upper electrode pattern, forming a second insulating layer on the upper electrode pattern, etching the second insulating layer to form a cavity that exposes the etch blocking spacer, and forming a contact ball in the cavity.

The method may further include the step of forming an etch stop film on the lower electrode pattern and below the first insulating layer.

The step of forming a lower electrode pattern may include the step of forming a plurality of lower electrodes spaced apart from one another on the substrate.

The step of forming an upper electrode pattern may include the step of forming a plurality of upper electrodes spaced apart from one another on the first insulating layer.

The etch blocking spacer may cover a side of each of the plurality of the upper electrodes. The step of forming an etch blocking spacer may further include the steps of forming a conductive material layer on an uppermost surface and at a vertical side of each of the plurality of the upper electrodes, and on an uppermost surface of the first insulating layer, and etching back the conductive material layer to form the etch blocking spacer.

The step of forming an etch blocking spacer may further include the steps of forming an insulating material layer on the uppermost surface and at the side of each of the plurality of upper electrodes and on the uppermost surface of the first insulating layer, forming a conductive material layer on the insulating material layer, and etching back the conductive material layer and the insulating material layer to form the etch blocking spacer.

The step of etching the second insulating layer to form a cavity may include the steps of etching the second insulating layer and the first insulating layer to form a hole therein which exposes the etch stop film, and etching the second insulating layer and the etched first insulating layer to form the cavity. Generally, the cavity exposes the etch blocking spacer.

The method may further include the step of forming a contact in contact with the lower electrode pattern passing through the first insulating layer and the etch stop film, wherein the second upper electrode pattern is in contact with the contact.

The upper electrode pattern may comprise a material selected from Al, Cu, Au, and alloys thereof (e.g., an alloy including at least one of Al, Cu, and Au), the etch stop film may be or comprise a silicon nitride film, and the first insulating layer and the second insulating layer may include at least one of $SiO_2$, $Si_xN_y$ (where x and y are real numbers greater than zero), FSG (fluorosilicate glass), USG (undoped silicate glass), BPSG (borophosphosilicate glass), and TEOS (tetraethoxysilane), and the etch blocking layer comprises or is formed of tungsten.

The conductive material layer may include at least one of TiN, Ti, W, Au, Ag, and doped Si, and the insulating material layer may include at least one of $SiO_2$, SiN, Si, $HfO_2$, $Al_2O_3$, and SiON.

In another aspect of the present invention, a semiconductor device includes a substrate, a lower electrode pattern on the substrate, an etch stop film on the lower electrode pattern, a first insulating layer on the etch stop film, an upper electrode pattern on the first insulating layer, an etch blocking spacer at a side of the upper electrode pattern, a second insulating layer on the upper electrode pattern, a cavity in the second insulating layer exposing the etch blocking spacer, and a contact ball in the cavity. The semiconductor device may further include a contact which connects the lower electrode pattern to the upper electrode pattern passing through the first insulating layer and the etch stop film.

The cavity may be in the second insulating layer and the first insulating layer, and may expose the etch stop film.

The upper electrode pattern may include a plurality of upper electrodes, and the etch blocking spacer may be at a vertical side of each of the plurality of upper electrodes.

The etch blocking spacer may include a first spacer including at least one of TiN, Ti, W, Au, Ag, and doped Si. The etch blocking spacer may further include a second spacer between a sidewall of each of the upper electrodes and the first spacer, which may include at least one of $SiO_2$, SiN, Si, $HfO_2$, $Al_2O_3$, and SiON.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and which are incorporated in and constitute a part of this application, illustrate embodiment(s) of the disclosure and together with the description serve to explain the principle(s) of the disclosure. In the drawings.

DESCRIPTION OF SPECIFIC EMBODIMENTS

Figure 1:
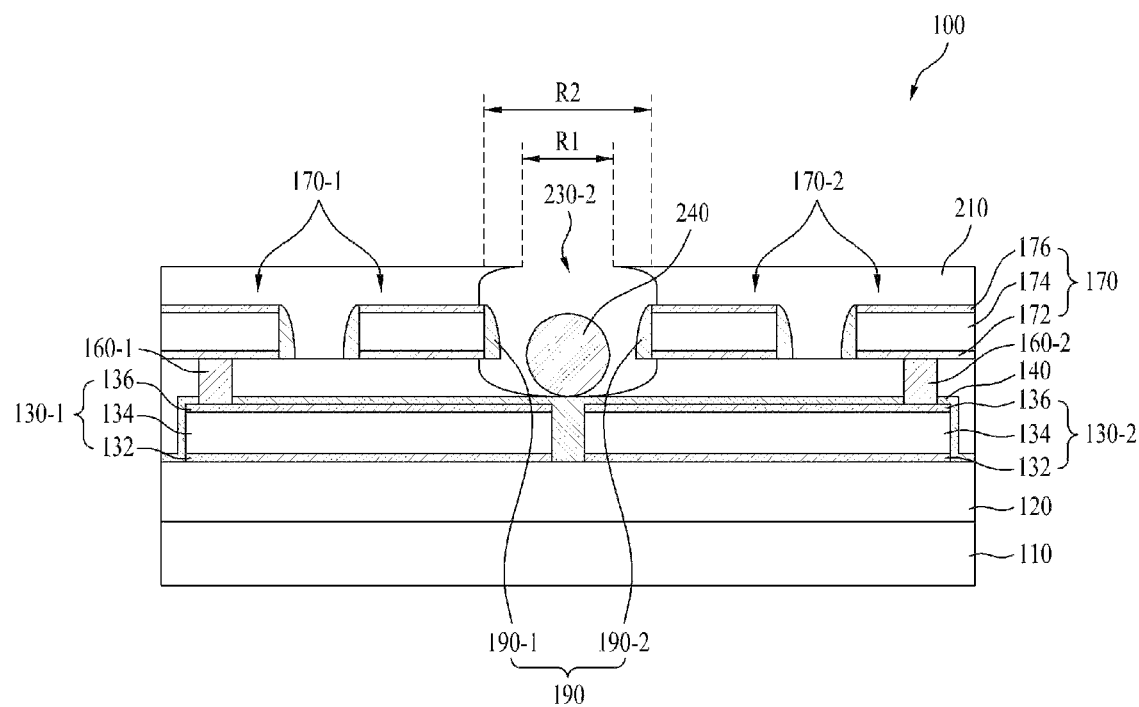
FIG. 1 illustrates a cross-section of an exemplary semiconductor device in accordance with an embodiment of the invention.

Reference will now be made in detail to the specific embodiments of the present invention, examples of which are illustrated in the accompanying drawings. In the description of the following embodiments, if it is described that a layer, a film, a region, a pattern, or a structure is formed "on" or "under" a substrate, layer, film, region, pad, or pattern, the "on" or "under" implies that the layer, film, region, pattern, or structure is formed "on" or "under" the substrate, the other layer, other film, other region, other pad, or other pattern directly or indirectly, with one or more other substrates, layers, films, regions, pads, or patterns therebetween. Also, a reference on the "on" or "under" is the drawing.

A thickness or a size of a layer shown in a drawing can be exaggerated, omitted or shown schematically for convenience or clarity of description. Also, the size of an element may not be shown to scale, perfectly. In addition, the same reference number refers to the same elements throughout description of the drawings. A semiconductor device and a method for manufacturing the same of the present invention will be described with reference to the attached drawings.

FIGS. 2 to 9 illustrate cross-sections showing the steps of a method for manufacturing a semiconductor device in accordance with embodiments of the present invention. For example, one embodiment may suggest a method for manufacturing an MMS (Micro Metal Sphere) switch.

Figure 2:
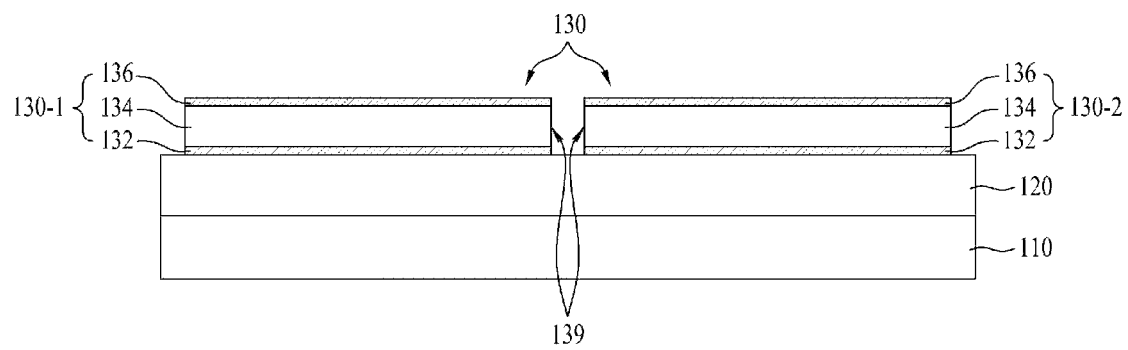
FIGS. 2 to 9 illustrate cross-sections showing steps of an exemplary method for manufacturing a semiconductor device in accordance with embodiments of the present invention.

Referring to FIG. 2, an insulating layer 120 is formed on a substrate 110. The substrate 110 may be or comprise a monocrystalline silicon substrate, a poly-crystalline silicon substrate, or a semiconductor substrate. The substrate 110 may have a device isolation film (not shown) formed thereon that divides an active region and a device isolation region. Also, the substrate 110 may have p type impurities or n type impurities implanted therein.

The insulating layer 120 may include at least one of oxide (e.g., silicon dioxide) and nitride (e.g., silicon nitride), and may be single or multi-layered. For example, the insulating layer 120 may be deposited on the substrate by CVD (Chemical Vapor Deposition), and may include at least one of, but not limited to, $SiO_2$, $Si_xN_y$ (where x and y are real numbers >0), FSG (fluorosilicate glass), USG (undoped silicate glass), BPSG (borophosphosilicate glass), and TEOS (tetraethoxysilane).

Then, a lower electrode pattern 130 is formed on the insulating layer 120. The lower electrode pattern 130 may have a stacked structure comprising a first barrier layer 132, a first main electrode layer 134, and a second barrier layer 136. The first barrier layer 132 and the second barrier layer 136 may prevent metal ions of the first main electrode layer 134 from diffusing to other layers (for example, the insulating layer 120). The first and the second barrier layers 132 and 136 may comprise a barrier material which blocks diffusion of the metal ions, for example, TiN, Ti or a TiN/Ti bilayer or alloy. The first main electrode layer 134 may comprise a material having good conductivity, such as Al, Au, Cu, or an alloy including at least one of Al, Au, and Cu (for example, an Al—Cu alloy).

The lower electrode pattern 130 may include a plurality of lower electrodes (for example, 130-1 and 130-2) spaced apart from one another and/or isolated from one another, electrically. For example, the lower electrode pattern 130 may include a first lower electrode 130-1, and a second lower electrode 130-2 spaced apart from and/or electrically isolated from the first lower electrode 130-1. Though FIG. 2 illustrates only two lower electrodes 130-1 and 130-2, the number of lower electrodes is not limited to this, and may be more than 3. For example, by depositing the first barrier layer 132, the first main electrode layer 134, and the second barrier layer 136 on the insulating layer 120 in succession by CVD (Chemical Vapor Deposition) or sputtering, and by patterning the layers 132, 134, and 136 deposited thus by photolithography and etching, a plurality of lower electrodes (for example, 130-1 and 130-2) may be formed.

Referring to FIG. 2, the patterning by photolithography and etching may expose or open sides (e.g., vertical sides or sidewalls) of the first main electrode layers 134 of the first lower electrode 130-1 and the second lower electrode 130-2 as well as the first and second barrier layers 132 and 136, respectively. Moreover, patterning by photolithography and etching may expose or open a portion of the insulating layer 120, for example, a portion of an upper side (e.g., an uppermost surface) of the insulating layer 120.

Figure 3:
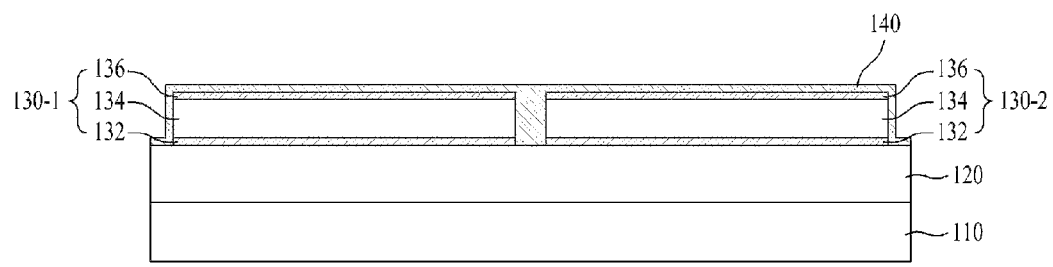

Referring to FIG. 3, an etch stop film 140 is formed on the insulating layer 120 and the lower electrode pattern 130, to cover the lower electrode pattern 130. For example, the etch stop film 140 may be formed on exposed sides of the first and second barrier layers 132 and 136, an uppermost surface of the barrier layer 136, and the exposed portion of the insulating layer 120 in FIG. 2. The etch stop film 140 may stop etching at a time of etching one or more overlying layers to provide a space 230-2 (shown in FIG. 7) and position a contact ball therein. The etch stop film 140 may comprise a material having an etch selectivity higher than an overlying insulating layer (e.g., insulating layer 150, to be described later), for example, silicon nitride (SiN).

Figure 4:
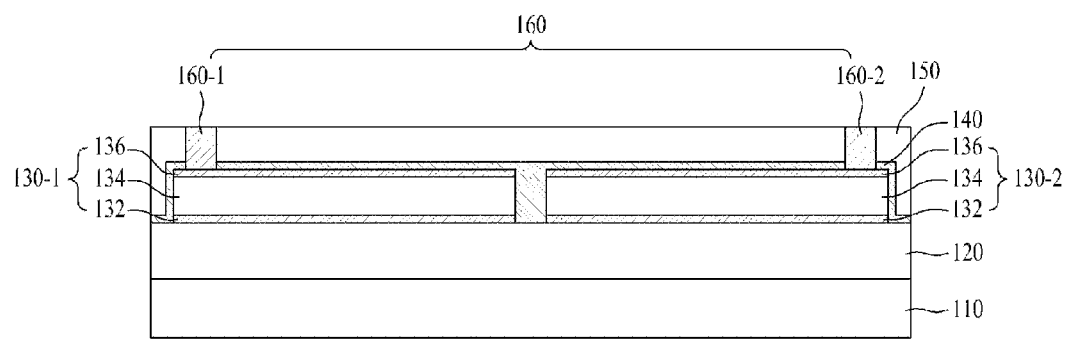

Referring to FIG. 4, the first insulating layer 150 (e.g., a first insulating layer) is formed on the etch stop film 140. For example, the first insulating layer 150 may be formed on the etch stop film 140 by CVD (Chemical Vapor Deposition), and may include at least one of oxide and nitride (e.g., silicon dioxide and/or silicon nitride), for example at least one of, but not limited to, $SiO_2$, $Si_xN_y$ (where x and y are real numbers >0), FSG (fluorosilicate glass), USG (undoped silicate glass), BPSG (borophosphosilicate glass), and TEOS (tetraethoxysilane).

Then, a plurality of contacts 160 are formed which are in contact with the lower electrode pattern 130 and that pass through the first insulating layer 150 and the etch stop film 140. For example, a first contact 160-1 in contact with the first lower electrode 130-1 passes through a region of each of the first insulating layer 150 and the etch stop film 140, and a second contact 160-2 in contact with the first lower electrode 130-2 passes through another region of each of the first insulating layer 150 and the etch stop film 140. Though FIG. 4 illustrates only two contacts, the number of contacts are not limited to this, and may be more than three. Also, at least one contact may be in contact with each of the plurality of the lower electrodes (for example, 130-1 and 130-2).

Though the contact 160 can be formed as follows, methods for forming the contact 160 are not limited to this. For example, a photoresist pattern (not shown) is formed on the first insulating layer 150. The first insulating layer 150 and the etch stop film 140 are then etched using the photoresist pattern (not shown) formed thus as an etch mask to form a via hole (not shown). Thereafter, a conductive material (for example, tungsten) is deposited in the via hole (e.g., by CVD) to fill the via hole, and planarized to form the contacts 160-1 and 160-2.

Figure 5:
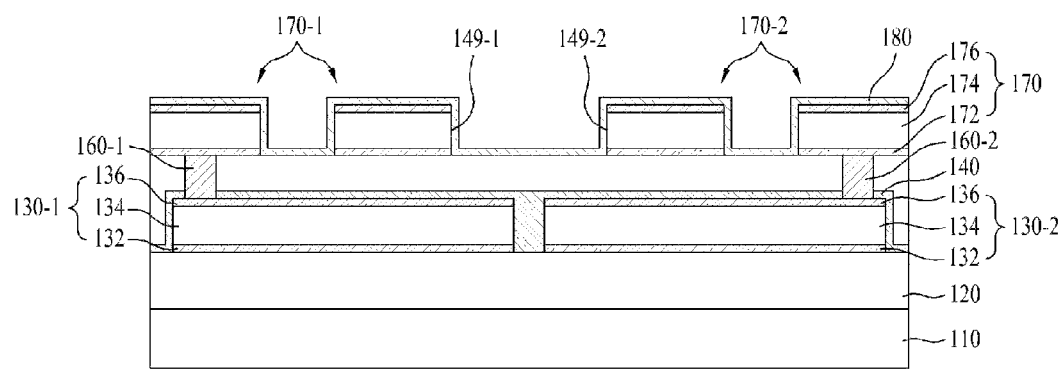

Referring to FIG. 5, an upper electrode pattern 170 is formed on the first insulating layer 150. The upper electrode pattern 170 may have a stacked structure comprising a third barrier layer 172, a second main electrode layer 174, and a fourth barrier layer 176. The third barrier layer 172 and the fourth barrier layer 176 prevent metal ions of the second main electrode layer 174 from diffusing to other layers (for example, the first and second insulating layers 150 and 210). The third and fourth barrier layers 172 and 176 may comprise a barrier metal material, such as TiN, Ti or a TiN/Ti bilayer or alloy. The second main electrode layer 174 may comprise a material having good conductivity, such as Al, Cu, Au, or an alloy including at least one of Al, Cu, and Au (for example, an Al—Cu alloy).

The upper electrode pattern 170 may include a plurality of upper electrodes (for example, 170-1 and 170-2) spaced apart from one another and/or isolated from one another, electrically. For example, the upper electrode pattern 170 may include the first upper electrode 170-1 and the second upper electrode 170-2.

For example, by depositing the third barrier layer 172, the second main electrode layer 174, and the fourth barrier layer 176 on the first insulating layer 150 by CVD (Chemical Vapor Deposition) or sputtering in succession, and patterning the layers 172, 174, and 176 by photolithography and etching, the plurality of the upper electrodes (for example, 170-1, and 170-2) may be spaced apart from one another. The patterning by photolithography and etching may expose a side (e.g., a vertical side or sidewall) of each of the plurality of the upper electrodes (for example, 170-1, and 170-2). For example, a side 149-1 or 149-2 of the second main electrode layer 174 in each of the plurality of the upper electrodes (for example, 170-1 and 170-2) may be exposed or opened, as well as the third and fourth barrier layers 172 and 176. Also, patterning by photolithography and etching may expose or open a portion of the first insulating layer 150, for example, a portion of an uppermost surface of the first insulating layer 150.

The upper electrode pattern 170 may be electrically connected to the lower electrode pattern 130 through the contact pattern 160. For example, the first upper electrode 170-1 may be electrically connected to the first contact 160-1, and the second upper electrode 170-2 may be electrically connected to the second contact 160-2. At least one of the plurality of the upper electrodes (for example, 170-1 and 170-2) may be on and in contact with a contact 160. For example, a portion of the first upper electrode 170-1 may be on the first contact 160-1 and may be in contact with the first contact 160-1. A portion of the second upper electrode 170-2 may be on the second contact 160-2 and may be in contact with the second contact 160-2.

Then, an etch blocking layer 180 is formed on the first insulating layer 150 to cover the upper electrode pattern 170. For example, the etch blocking layer 180 may be formed on an uppermost surface and at an exposed side of each of the plurality of upper electrodes (for example, 170-1 and 170-2), and on an uppermost surface of the exposed first insulating layer 150. The etch blocking layer 180 may comprise a material having an etch selectivity higher than the first insulating layer 150 and an overlying insulating layer (e.g., second insulating layer 210) to be described later, and may be a single layer or multi-layers.

Figure 10A:
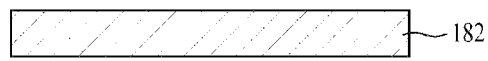
FIGS. 10A and 10B illustrate cross-sections showing variations of the etch blocking layer in FIG. 5.
Figure 10B:

FIGS. 10A and 10B illustrate cross-sections showing variations of the etch blocking layer in FIG. 5. As shown in FIG. 10A, the etch blocking layer 180 may be or comprise a first blocking layer 182, including a conductive material, for example, at least one of TiN, Ti, W, Au, Ag, and doped Si, and may be a single layer or multi-layers.

Referring to FIG. 10B, the etch blocking layer 180 may include a second blocking layer 184 and the first blocking layer 182 stacked or deposited in succession. The second blocking layer 184 may include an insulating material, for example, at least one of $SiO_2$, SiN, Si, $HfO_2$, $Al2O_3$, and SiON, and may be a single layer or multi-layers. The first blocking layer 182 may be the same as described before with regard to FIG. 10A. The second blocking layer 184 is formed on an uppermost surface and at exposed sides of each of the plurality of upper electrodes (for example, 170-1 and 170-2), and an exposed uppermost surface of the first insulating layer 150, and the first blocking layer 182 is formed on the second blocking layer 184.

Figure 6:
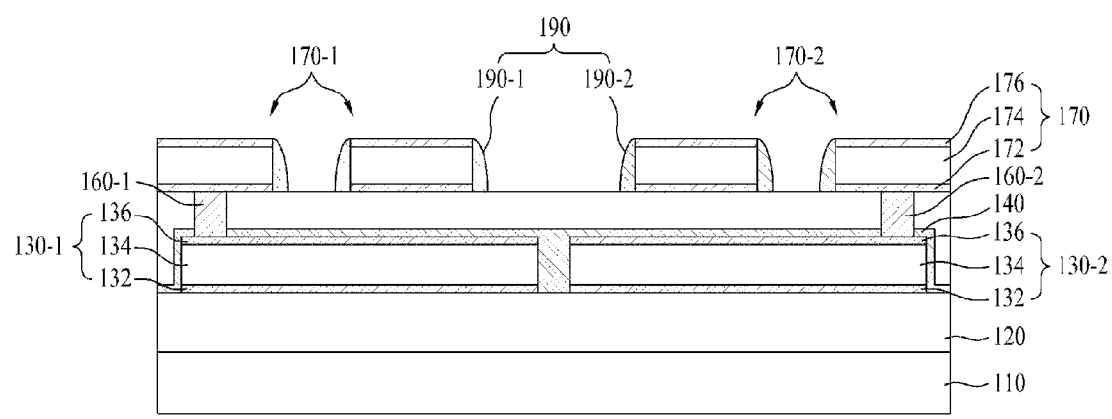

Referring to FIG. 6, the etch blocking layer 180 is etched to form an etch blocking spacer 190 at a side (e.g., vertical side or sidewall) of the upper electrode pattern 170. The etch blocking spacer 190 may be formed at sides of each of the upper electrodes (for example, 170-1 and 170-2).

For example, an etch back is performed to remove a portion of the etch blocking layer 180 from the uppermost surface of each of the plurality of upper electrodes (for example, 170-1 and 170-2), and from the uppermost surface of the first insulating layer 150, to form the etch blocking spacer 190. The etch blocking spacer 190 may cover at least the side (e.g., sidewalls) of the second main electrode layer 174 of each of the plurality of the upper electrodes (for example, 170-1 and 170-2). The etch blocking spacer 190 may have a structure variable with a configuration of the etch blocking layer 180.

Figure 11A:
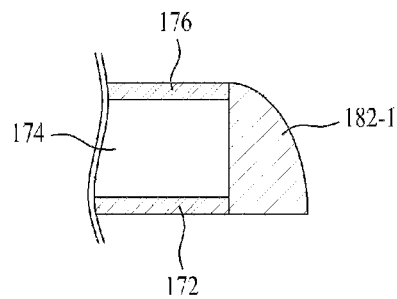
FIGS. 11A and 11B illustrate cross-sections showing variations of the etch blocking spacer in FIG. 6.
Figure 11B:
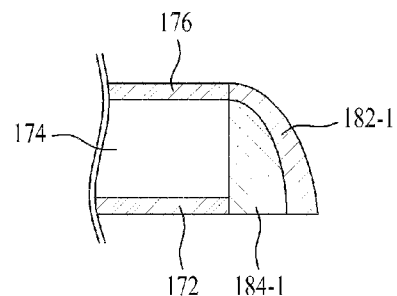

FIGS. 11A and 11B illustrate cross-sections showing variations of the etch blocking spacer in FIG. 6.

Referring to FIG. 11A, the etch blocking spacer 190 may include a first spacer 182-1, including a conductive material, for example, at least one of TiN, Ti, W, Au, Ag, and doped Si, and may be a single layer or multi-layers.

Referring to FIG. 11B, the etch blocking spacer 190 may include a first spacer 182-1 and a second spacer 184-1. The first spacer 182-1 may be at a side (e.g., sidewalls) of each of the plurality of upper electrodes (for example, 170-1 and 170-2). The second spacer 184-1 may be on and in contact with the side (e.g., sidewalls) of each of the plurality of upper electrodes (for example, 170-1 and 170-2), and the first spacer 182-1 may be on the outer surface of the second spacer 184-1. The second spacer 184-1 corresponds to the second blocking layer 184, may include an insulating material, for example, at least one of $SiO_2$, SiN, Si, $HfO_2$, $Al_2O_3$, and SiON, and may be a single layer or multi-layers. The first spacer 182-1 corresponds to the first blocking layer 182, may include at least one of TiN, Ti, W, Au, Ag, and doped Si, and may be a single layer or multi-layers.

The first spacer 182-1 may have a surface in electrical contact with a side of the upper electrode (for example, 170-1 or 170-2). For example, a substantially vertical surface of the first spacer 182-1 may be in contact with the fourth barrier layer 176 of the upper electrode (for example, 170-1 or 170-2). Because the second spacer 184-1 comprises an insulating material, the first spacer 182-1 is generally in electrical contact with the upper electrode (for example, 170-1 or 170-2).

Figure 7:
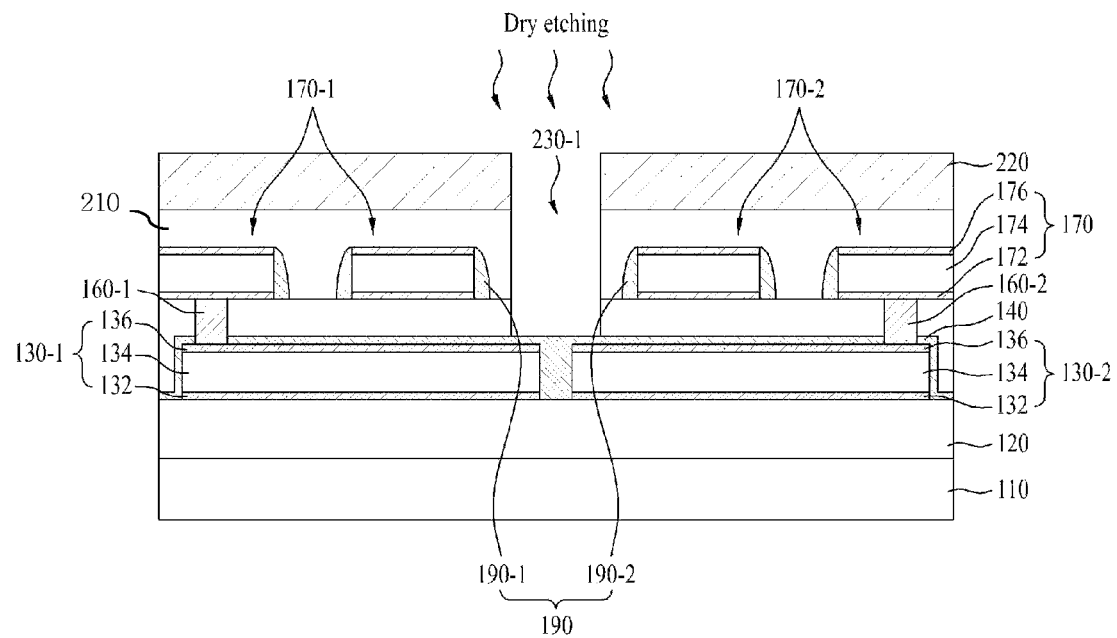

Referring to FIG. 7, a second insulating layer 210 (e.g., a second interlayer insulating layer) is formed on the first insulating layer 150 to cover the etch blocking spacer(s) 190 and the upper electrode pattern 170. The second insulating layer 210 comprises a material, and is formed by a method, that is generally the same as the first insulating layer 150 described before.

Then, a photoresist pattern 220 is formed on the second insulating layer 210 by photolithography. The photoresist pattern 220 may expose at least a portion of an uppermost surface of the second insulating layer 210 between the plurality of upper electrodes (for example, 170-1 and 170-2). Then, a first etching is performed, in which the exposed second insulating layer 210 and the first insulating layer 150 are etched using the photoresist pattern 220 as an etch mask to form a hole 230-1 which exposes the etch stop film 140. The first etching may comprise or consist of dry etching. The etch stop film 140 may stop further etching in the first etching step, and the hole 230-1 may expose a portion of the etch stop film 140, but not the etch blocking spacer 190.

Figure 8:
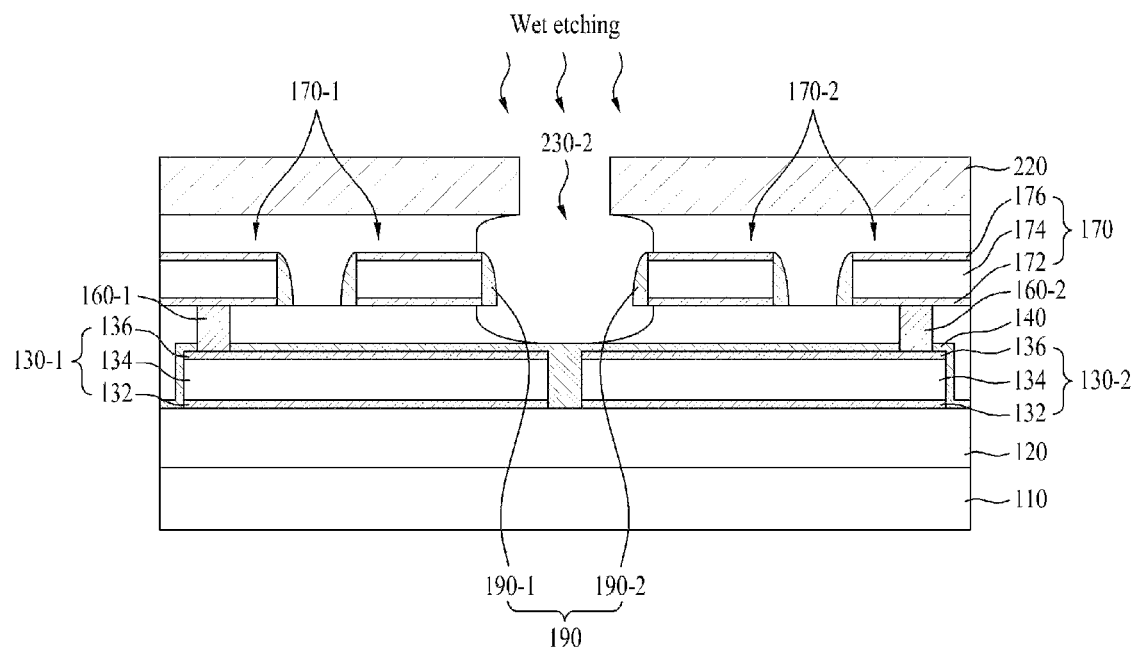

Referring to FIG. 8, a second etching is performed, in which the second insulating layer 210 and the first insulating layer 150 are further etched using the photoresist pattern 220 as an etch mask, to form a cavity 230-2 which exposes the etch blocking spacer 190. The cavity 230-2 formed thus may have a top side or opening with a radius R1 smaller than a radius R2 of a middle portion of the cavity 230-2.

The etch blocking spacer 190 is exposed in the cavity 230-2 (which will have a contact ball to be described later therein), at a side of the upper electrode (for example, 170-1 or 170-2) facing the cavity 230-2. In one example, only the etch blocking spacer 190 is exposed in the cavity 230-2, and the upper electrode is completely covered by insulating layers 150 and 210 and the etch blocking spacer 190. Alternatively, the cavity 230-2 may also expose a portion of the third barrier layer 172 adjacent to the exposed etch blocking spacer 190 and a portion of an uppermost surface of the fourth barrier layer 176.

The second etching may comprise or consist of wet etching, using an etchant that is a mixture of, for example, DIW (deionized water) with an HF-based chemical (e.g., HF, $NH_4F$, $HBF_4$, $HPF_6$, combinations thereof, etc.). In the second etching, the etchant may flow into the hole 230-1 to etch the second insulating layer 210 and the first insulating layer 150.

The second etching may include the following two steps. The first step may include etching for 1 to 20 minutes with DHF (diluted HF) with an $H_2O$ to HF ratio of 1:1~1000:1, and the second step may include etching for 1 to 20 minutes with BHF (buffered HF) with an $NH_4F$ to HF ratio of 3~100:1.

The etch blocking spacer 190 may serve to protect the first upper electrode 170-1 and the second upper electrode 170-2 from the second etching. Since the etch blocking spacer 190 has an etch selectivity higher than the first and second insulating layers 150 and 210, almost no etching of the etch blocking spacer 190 takes place in the second etching.

The cavity 230-2 may expose the etch stop film 140, and the etch stop film 140 may prevent the lower electrode pattern 130 from being damaged by the second etching. A material of the second main electrode layer 174 of each of the first upper electrode 170-1 and the second upper electrode 170-2, for example, Cu, Al, Au or a Cu—Al alloy, is susceptible to damage by the etchant in the second etching.

If there is no etch blocking spacer 190, the second insulating layer 210 and the first insulating layer 150 may be etched in the second etching to expose a side (e.g., vertical side or sidewall) and an uppermost and/or lowermost surface of each of the first upper electrode 170-1 and the second upper electrode 170-2, exposing the side of the main electrode layer 174 of each of the first upper electrode 170-1 and the second upper electrode 170-2 to damage by the etchant in the second etching, which may cause switching malfunctions in the semiconductor device, thereby making reliability and yield of the semiconductor device poor. However, by forming the etch blocking spacer 190 of a material having an etch selectivity higher than the first and second insulating layers 150 and 210, and covering the vertical sides of the first upper electrodes 170-1 and the second upper electrodes 170-2, which are liable to be exposed to the second etching, etching damage to the main electrode layers 174 of the first upper electrode 170-1 and the second upper electrode 170-2 can be prevented in the second etching.

Eventually, the formation of the upper electrode pattern 170 of a material insensitive to the wet etching etchant for forming or securing the cavity 230-2 in which the contact ball is to be positioned enables improvement in the degrees of freedom of the upper electrode pattern 170, assures reliability of switching functions in the semiconductor device, and prevents yield reductions.

Figure 9:
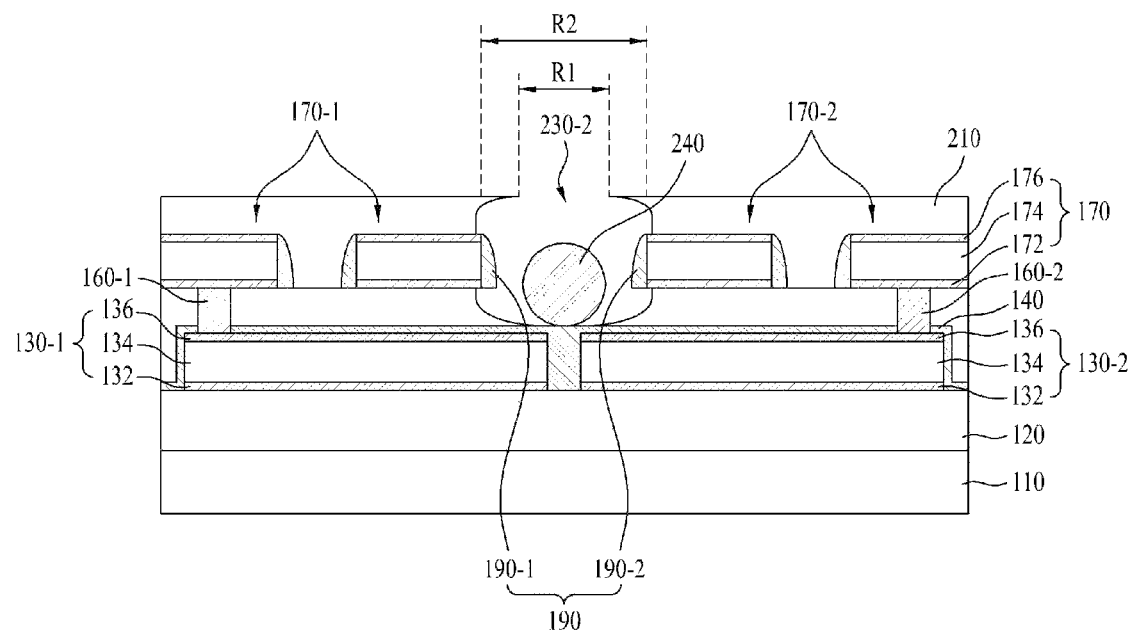

Referring to FIG. 9, a contact ball 240 is formed in the cavity 230-2 (e.g., on the etch stop film 140). For example, the contact ball 240 may be formed as follows.

At first, a conductive material layer (not shown), for example, a metal layer, is formed on the etch stop film 140 in the cavity 230-2 and on the photoresist pattern 220. The conductive material layer may be formed by CVD (e.g., if a coating of the conductive material layer is desired over substantially the entire surface of the cavity 230-2) or sputtering (e.g., collimated sputtering; if the coating of the conductive material layer is desired over substantially only the etch stop film 140. The metal may comprise a relatively low-melting metal or alloy, such as aluminum, alloys of tin, copper, silver, bismuth, indium, zinc and/or antimony, etc.

Then, lift-off is performed to remove the photoresist pattern 220 and the conductive material layer thereon together. The lift-off does not remove the conductive material layer on the etch stop film 140 in the cavity 230-2, and leaves a portion of the conductive material on the etch stop film 140 (and optionally on other surfaces) in the cavity 230-2.

Then, the portion of the conductive material remaining in the cavity 230-2 is annealed (e.g., by rapid thermal annealing [RTA], or if the opening of the cavity 230-2 is about as wide as or wider than a laser spot, by laser annealing) to form the contact ball 240 on the etch stop film 140 in the cavity 230-2. The cavity 230-2 may include an air void, and as the contact ball 240 is brought into contact with either the first etch blocking spacer 190-1 or the second etch blocking spacer 190-2, the semiconductor device may perform a switching function.

FIG. 1 illustrates a cross-section of a semiconductor device 100 in accordance with an embodiment. The semiconductor device 100 may be or comprise a Micro Metal Sphere switch. Parts having reference numbers the same with FIGS. 2 to 9 denote identical elements, and descriptions repetitive with the foregoing description may be omitted or described briefly.

Referring to FIG. 1, the semiconductor device 100 includes an insulating layer 120 on a substrate 110, a lower electrode pattern 130 on the insulating layer 120, an etch stop film 140 on the lower electrode pattern 130, a first insulating layer 150 on the etch stop film 140, a contact 160 connected to the lower electrode pattern 130 and passing through the first insulating layer 150, an upper electrode pattern 170 on the first insulating layer 150 connected to the contact, a second insulating layer 210 on the upper electrode pattern 170, a cavity 230-2 in the second insulating layer 210 and the first insulating layer 150 exposing the etch stop film 140, a contact ball 240 in the cavity 230-2, and an etch blocking spacer 190 at a side (e.g., a vertical side or sidewall) of the upper electrode pattern 170. The vertical side or sidewall of the upper electrode pattern 170 would be exposed by the cavity 230-2 if not for the etch blocking spacer 190.

The contact ball 240 can be brought into contact with any one of the etch blocking spacers 190-1 and 190-2 exposed by the cavity 230-2. The switching action of the device may be fixed, depending on which one of the first etch blocking spacer 190-1 or the second etch blocking spacer 190-2 the contact ball 240 is brought into contact. For example, the upper electrode pattern 170 may further include a third upper electrode (not shown) electrically separated from the first upper electrode 170-1 and the second upper electrode 170-2, and the etch blocking spacer 190 may further include a third etch blocking spacer which covers a side (e.g., a vertical side or sidewall) of the third upper electrode (not shown). If the contact ball 240 is brought into contact with the first etch blocking spacer 190-1 and the third etch blocking spacer (not shown) at the same time, a first switching function may take place, in which the first upper electrode 170-1 and the third upper electrode (not shown) are connected electrically. Alternatively, if the contact ball 240 is brought into contact with the second etch blocking spacer 190-2 and the third etch blocking layer (not shown) at the same time, a second switching function may take place, in which the second upper electrode 170-2 and the third upper electrode (not shown) are connected electrically.

As has been described, an upper electrode pattern may be formed which is insensitive to the etchant used in wet etching for forming or securing a space or cavity for a contact ball, thereby improving degrees of freedom of the upper electrode pattern, assuring reliability of switching functions in the semiconductor device, and preventing a decrease in yield.

Characteristics, structures, effects, and so on described in the above embodiments are included in at least one of the embodiments of the present invention, but not limited to only one embodiment invariably. Furthermore, it is apparent that the features, the structures, the effects, and so on described in the exemplary embodiments can be combined with or modified by other embodiments by persons skilled in this field of art. Therefore, it is understood that such combination(s) and modification(s) are included in the scope of the present invention.

What is claimed is:

1. A method for manufacturing a semiconductor device comprising:
   forming a lower electrode pattern on a substrate;
   forming a first insulating layer on the lower electrode pattern;
   forming an upper electrode pattern on the first insulating layer;
   forming an etch blocking spacer at a side of the upper electrode pattern;
   forming a second insulating layer on the upper electrode pattern;
   etching the second insulating layer to form a cavity which exposes the etch blocking spacer; and
   forming a contact ball in the cavity.

2. The method as claimed in claim 1, further comprising forming an etch stop film on the lower electrode pattern before forming the first insulating layer.

3. The method as claimed in claim 1, wherein forming the lower electrode pattern includes forming a plurality of lower electrodes spaced apart from one another on the substrate.

4. The method as claimed in claim 1, wherein forming the upper electrode pattern includes forming a plurality of the upper electrodes spaced apart from one another on the first insulating layer.

5. The method as claimed in claim 4, wherein forming the etch blocking spacer includes forming an etch blocking spacer to cover a side of each of the plurality of upper electrodes.

6. The method as claimed in claim 5, wherein forming the etch blocking spacer further includes:
   forming a conductive material layer on an uppermost surface and at a side of each of the plurality of upper electrodes, and on an uppermost surface of the first insulating layer, and
   etching back the conductive material layer to form the etch blocking spacer.

7. The method as claimed in claim 5, wherein forming the etch blocking spacer further includes:
   forming an insulating material layer on the uppermost surface and at the side of each of the plurality of upper electrodes and on the uppermost surface of the first insulating layer,
   forming a conductive material layer on the insulating material layer, and
   etching back the conductive material layer and the insulating material layer to form the etch blocking spacer.

8. The method as claimed in claim 5, wherein forming the etch blocking spacer further includes:
   forming an insulating material layer on the uppermost surface and at the side of each of the plurality of upper electrodes and on the uppermost surface of the first insulating layer,
   etching back the insulating material layer to form a first spacer,
   forming a conductive material layer on the uppermost surface and at an upper side surface of each of the plurality of upper electrodes, on the first spacer, and on the uppermost surface of the first insulating layer, and
   etching back the conductive material layer to form the etch blocking spacer.

9. The method as claimed in claim 1, wherein etching the second insulating layer to form the cavity includes:
   etching the second insulating layer and the first insulating layer to form a hole therein which exposes the etch stop film; and further etching the second insulating layer and the first insulating layer to form the cavity which exposes the etch blocking spacer.

10. The method as claimed in claim 2, further comprising forming a contact in contact with the lower electrode pattern passing through the first insulating layer and the etch stop film, wherein the second upper electrode pattern is in contact with the contact.

11. The method as claimed in claim 2, wherein the upper electrode pattern comprises a material selected from Al, Cu, Au, and alloys including at least one of Al, Cu, and Au,
the etch stop film comprises a silicon nitride film, and
the first insulating layer and the second insulating layer include at least one of $SiO_2$, $Si_xN_y$ (where x and y are real numbers >0), fluorosilicate glass, undoped silicate glass, borophosphosilicate glass, and tetraethoxysilane, and
the etch blocking layer comprises tungsten.

12. The method as claimed in claim 6, wherein the conductive material layer includes at least one of TiN, Ti, W, Au, Ag, and doped Si.

13. The method as claimed in claim 7, wherein the insulating material layer includes at least one of $SiO_2$, SiN, Si, $HfO_2$, $Al_2O_3$, and SiON, and the conductive material layer includes at least one of TiN, Ti, W, Au, Ag, and doped Si.

* * * * *